US012563711B2

(12) United States Patent
Mikami

(10) Patent No.: US 12,563,711 B2
(45) Date of Patent: Feb. 24, 2026

(54) ELECTROMAGNETIC WAVE SHIELDING MATERIAL, ELECTRONIC COMPONENT, AND ELECTRONIC APPARATUS

(71) Applicant: FUJIFILM Corporation, Tokyo (JP)

(72) Inventor: Tatsuo Mikami, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 378 days.

(21) Appl. No.: 18/336,496

(22) Filed: Jun. 16, 2023

(65) Prior Publication Data

US 2023/0328944 A1 Oct. 12, 2023

Related U.S. Application Data

(63) Continuation of application No. PCT/JP2021/047506, filed on Dec. 22, 2021.

(30) Foreign Application Priority Data

| Dec. 25, 2020 | (JP) | ................................. | 2020-217420 |
| May 17, 2021 | (JP) | ................................. | 2021-083050 |
| Oct. 29, 2021 | (JP) | ................................. | 2021-177964 |
| Dec. 15, 2021 | (JP) | ................................. | 2021-203157 |

(51) Int. Cl.
*H05K 9/00* (2006.01)

(52) U.S. Cl.
CPC ......... *H05K 9/0088* (2013.01); *H05K 9/0071* (2013.01); *H05K 9/0075* (2013.01)

(58) Field of Classification Search
CPC ..... H05K 9/008; H05K 9/0071; H05K 9/0075
See application file for complete search history.

(56) References Cited

U.S. PATENT DOCUMENTS

| 2003/0190498 A1* | 10/2003 | Fujieda | ................ | H05K 1/0233 |
| | | | | 427/128 |
| 2007/0252771 A1 | 11/2007 | Maezawa et al. | | |
| 2016/0125987 A1* | 5/2016 | Moon | ........................ | H01F 1/26 |
| | | | | 252/62.54 |

| 2018/0079176 A1 | 3/2018 | Tanaka |
| 2018/0205142 A1 | 7/2018 | Jung et al. |
| 2020/0253098 A1 | 8/2020 | Lee et al. |

FOREIGN PATENT DOCUMENTS

| CN | 107432102 A | 12/2017 |
| CN | 107578846 A | 1/2018 |
| CN | 111031774 A | 4/2020 |
| EP | 1 819 211 A1 | 8/2007 |
| JP | 61-193499 A | 8/1986 |
| JP | 62-256498 A | 11/1987 |
| JP | H03-6898 A | 1/1991 |
| JP | 7-079085 A | 3/1995 |
| JP | 2000-252113 A | 9/2000 |
| JP | 2009-081234 A | 4/2009 |
| JP | 2019-503068 A | 1/2019 |

OTHER PUBLICATIONS

Extended European Search Report issued May 28, 2024 in European Application No. 21910841.2.
Office Action issued Jul. 15, 2025 in Japanese Application No. 2022-571539.
International Search Report dated Mar. 15, 2022, issued in International Application No. PCT/JP2021/047506.
Written Opinion dated Mar. 15, 2022, issued in International Application No. PCT/JP2021/047506.
International Preliminary Report on Patentability (with translation of Written Opinion) dated Jun. 13, 2023, issued in International Application No. PCT/JP2021/047506.
Office Action dated Sep. 12, 2025, issued in Chinese application No. 202180085067.8.
Office Action dated Nov. 11, 2025 in Japanese Application No. 2022-571539.

* cited by examiner

*Primary Examiner* — Nicole M Ippolito

(74) *Attorney, Agent, or Firm* — Sughrue Mion, PLLC

(57) ABSTRACT

There are provided an electromagnetic wave shielding material including a multilayer structure having, between two metal layers, a high magnetic permeability layer that is an insulating layer in which a real part of a complex specific magnetic permeability at a frequency of 100 kHz is 30 or more, and an electronic component and an electronic apparatus which include the electromagnetic wave shielding material.

18 Claims, No Drawings

ELECTROMAGNETIC WAVE SHIELDING MATERIAL, ELECTRONIC COMPONENT, AND ELECTRONIC APPARATUS

CROSS-REFERENCE TO RELATED APPLICATIONS

This application is a Continuation of PCT International Application No. PCT/JP2021/047506 filed on Dec. 22, 2021, which claims priority under 35 U.S.C. § 119(a) to Japanese Patent Application No. 2020-217420 filed on Dec. 25, 2020, Japanese Patent Application No. 2021-083050 filed on May 17, 2021, Japanese Patent Application No. 2021-177964 filed on Oct. 29, 2021, and Japanese Patent Application No. 2021-203157 filed on Dec. 15, 2021. Each of the above applications is hereby expressly incorporated by reference, in its entirety, into the present application.

BACKGROUND OF THE INVENTION

1. Field of the Invention

The present invention relates to an electromagnetic wave shielding material, an electronic component, and an electronic apparatus.

2. Description of the Related Art

In recent years, an electromagnetic wave shielding material has attracted attention as a material for reducing the influence of an electromagnetic wave in various electronic components and various electronic apparatuses (see, for example, JP1991-6898A (JP-H3-6898A).

SUMMARY OF THE INVENTION

An electromagnetic wave shielding material (hereinafter, also described as a "shielding material") is capable of exhibiting a function of shielding electromagnetic waves (shielding performance) by reflecting electromagnetic waves incident on the shielding material by the shielding material and/or by attenuating the electromagnetic waves in the inside the shielding material.

The "electromagnetic wave" includes an electric field wave and a magnetic field wave. It is desirable that the electromagnetic wave shielding material is an electromagnetic wave shielding material that is capable of largely attenuating both an electric field wave and a magnetic field wave since both the influence of the electric field wave and the influence of the magnetic field wave can be reduced in electronic components and electronic apparatuses.

An aspect of the present invention is to provide a new electromagnetic wave shielding material that is capable of exhibiting high shielding performance against both an electric field wave and a magnetic field wave.

One aspect of the present invention relates to;

an electromagnetic wave shielding material comprising a multilayer structure having, between two metal layers, a high magnetic permeability layer that is an insulating layer in which a real part of a complex specific magnetic permeability at a frequency of 100 kHz is 30 or more.

In one form, the high magnetic permeability layer can include magnetic particles.

In one form, the magnetic particles can include metal particles.

In one form, the high magnetic permeability layer can include flat-shaped particles as the magnetic particles.

In one form, an alignment degree can be 30° or lower, where the alignment degree is a sum of an absolute value of an average value of alignment angles of the flat-shaped particles with respect to a surface of the high magnetic permeability layer and a variance of the alignment angles.

In one form, the high magnetic permeability layer can contain a resin.

In one form, a glass transition temperature Tg of the resin can be 50° C. or lower.

In one form, in a case where a thickness of one metal layer of the two metal layers is denoted as T1 and a thickness of the other metal layer is denoted as T2, T1 can be equal to or larger than T2, and a thickness ratio (T2/T1) can be 0.15 or more.

In one form, one or both of the two metal layers can be a metal layer in which a content of a metal selected from the group consisting of Al and Mg is 80.0% by mass or more.

In one form, the electromagnetic wave shielding material can comprise one or more layers selected from the group consisting of a pressure-sensitive adhesive layer and an adhesive layer.

In one form, a total thickness of the metal layers included in the electromagnetic wave shielding material can be 100 μm or less.

In one form, an overall thickness of the electromagnetic wave shielding material can be 200 μm or less.

One aspect of the present invention relates to an electronic component including the electromagnetic wave shielding material.

One aspect of the present invention relates to an electronic apparatus including the electromagnetic wave shielding material.

According to one aspect of the present invention, it is possible to provide a new electromagnetic wave shielding material that is capable of exhibiting high shielding performance against both an electric field wave and a magnetic field wave. In addition, according to one aspect of the present invention, it is possible to provide an electronic component and an electronic apparatus, which include the electromagnetic wave shielding material.

DESCRIPTION OF THE PREFERRED EMBODIMENTS

[Electromagnetic Wave Shielding Material]

One aspect of the present invention relates to an electromagnetic wave shielding material comprising a multilayer structure having, between two metal layers, a high magnetic permeability layer that is an insulating layer in which a real part of a complex specific magnetic permeability at a frequency of 100 kHz is 30 or more.

In the present invention and the present specification, the "electromagnetic wave shielding material" shall refer to a material that is capable of exhibiting shielding performance against an electromagnetic wave of at least one frequency or at least a part of a frequency band. The "electromagnetic wave" is classified into an electric field wave and a magnetic field wave. The "electromagnetic wave shielding material" is preferably a material that is capable of exhibiting shielding performance against both an electric field wave of at least one frequency or at least a part of a frequency band and a magnetic field wave of at least one frequency or at least a part of a frequency band, and it is more preferably a material that is capable of exhibiting shielding performance against an electric field wave in a wider frequency band and a magnetic field wave in a wider frequency band, where it is more preferable that higher shielding performance can be exhibited.

In a case where a complex specific magnetic permeability is measured by a magnetic permeability measuring apparatus, a real part μ' and an imaginary part μ' are generally displayed. In the present invention and the present specification, a real part of a complex specific magnetic permeability shall refer to such a real part μ'. Hereinafter, a real part of a complex specific magnetic permeability at a frequency of 100 kHz is also simply referred to as "magnetic permeability". The magnetic permeability can be measured by a commercially available magnetic permeability measuring apparatus or a magnetic permeability measuring apparatus having a known configuration.

In the present invention and the present specification, the "insulating property" means that the electrical conductivity is smaller than 1 siemens (S)/m. The electrical conductivity of a certain layer is calculated according to the following expression from the surface electrical resistivity of the layer and the thickness of the layer. The electrical conductivity can be measured by a known method.

Electrical conductivity [S/m]=1/(surface electrical resistivity [Ω]×thickness [m])

The thickness (overall thickness) of the electromagnetic wave shielding material and the thickness of each layer included in the electromagnetic wave shielding material shall be determined as an arithmetic average of thicknesses of five randomly selected points in an SEM image which is obtained by imaging a cross section exposed by a known method with a scanning electron microscope (SEM).

In the present invention and the present specification, the "metal layer" shall refer to a layer containing a metal. The metal layer can be a layer containing one or more kinds of metals as a pure metal consisting of a single metal element, as an alloy of two or more kinds of metal elements, or as an alloy of one or more kinds of metal elements and one or more kinds of non-metal elements. Details of the metal layer will be described later.

The inventors of the present invention speculate, as follows, the reason why the electromagnetic wave shielding material is capable of exhibiting high shielding performance against both the electric field wave and the magnetic field wave. However, the present invention is not limited to the speculation described in the present specification.

The propagation constant γ and the characteristic impedance Zs of a substance in a case where an electromagnetic wave is incident on the substance can be expressed by the following expression. In the following expression, j is an imaginary unit, ω is an angular frequency [1/s] of an electromagnetic wave, μ is a magnetic permeability [H/m] of a substance, σ is an electrical conductivity of [S/m] of a substance, and c is a dielectric constant [F/m] of a substance.

$$\gamma = \sqrt{j\omega\mu(\sigma + j\omega\epsilon)}$$

$$Z_s = \sqrt{\frac{j\omega\mu}{\sigma + j\omega\epsilon}}$$

The propagation constant γ relates to the attenuation of the amplitude of the electromagnetic wave in the substance, and the larger the γ is, the greater the degree of attenuation of the amplitude of the electromagnetic wave is. In a case of comparing a metal layer with the high magnetic permeability layer, since σ is very large in the metal layer, γ is also large. As a result, a large attenuation of the electromagnetic wave can be expected in the metal layer. On the other hand, in the high magnetic permeability layer, μ is large, and thus γ is large. As a result, the attenuation of the electromagnetic wave can be expected in the high magnetic permeability layer. On the other hand, the attenuation of the electromagnetic wave in a substance is very small in a substance in which μ, σ, and ε are all small, for example, air, a resin, or the like.

In addition, in a case where an electromagnetic wave is incident, the characteristic impedance Zs relates to the reflectivity and the transmittance at the time when the electromagnetic wave is emitted from the boundary. The larger the difference between the wave impedance of the electromagnetic wave and the characteristic impedance is, the greater the reflection at the substance boundary. In the metal layer, σ is large and μ is small, and thus the characteristic impedance is small. On the other hand, in the high magnetic permeability layer, μ is large, and thus σ is small and the characteristic impedance is large.

At a position sufficiently far from a wave source (for example, about ⅙ of the wavelength of the electromagnetic wave), the electromagnetic wave becomes a plane wave, and the wave impedance thereof is about 377Ω. On the other hand, the wave impedance at a position sufficiently close to a wave source (for example, closer than ⅙ of the wavelength of the electromagnetic wave) decreases as the wave source approaches the wave source in a case where the wave source is a minute loop current (a so-called magnetic field wave), and the wave impedance becomes large as it approaches a wave source in a case where the wave source is a minute dipole (a so-called electric field wave).

In the KEC method, which is a representative method for measuring the shielding performance, according to "Lumped constant equivalent circuit of electric field/magnetic field shielding effect measuring instrument (KEC method)" (Technical Report of the Institute of Image Information and Television Engineer Vol. 25.30 (2001)), the wave impedance at 100 kHz is 0.0033Ω in a case of a magnetic field wave, which is significantly smaller than 377Ω of the wave impedance of the plane wave. It is noted that KEC is an abbreviation for Kansai Electronic Industry Development Center.

Since the wave impedance of the magnetic field wave is small as described above, in a case where a magnetic field wave is incident on and then emitted from a metal layer having a small characteristic impedance, the difference between the wave impedance and the characteristic impedance is small, and thus the reflectivity at the interface becomes small. On the other hand, in a case where a magnetic field wave is incident on the high magnetic permeability layer having a large characteristic impedance and then is emitted, the reflectivity at the interface is higher than that of the metal layer since the difference between the wave impedance and the characteristic impedance is large.

In order to obtain high shielding performance against the electromagnetic wave in the electromagnetic wave shielding material, it is desirable to increase the reflection at the interface in addition to increasing the ability to attenuate the electromagnetic wave. That is, it is desirable that the electromagnetic wave repeatedly reflects at the interface and passes through the shielding material a large number of times to be largely attenuated. However, as described above, it can be said that as the behavior of a metal layer and the high magnetic permeability layer with respect to the electromagnetic wave, the reflection of the magnetic field wave at the interface is small although the metal layer has a large ability to attenuate the electromagnetic wave, and the reflection of the magnetic field wave at the interface is larger than that in the metal layer although the ability to attenuate the electromagnetic wave is larger in the high magnetic permeability layer than in the metal layer. Therefore, it is difficult to achieve both high reflection and high attenuation of the magnetic field wave with the metal layer alone or the high magnetic permeability layer alone.

On the other hand, due to including a multilayer structure having the high magnetic permeability layer between two metal layers, the electromagnetic wave shielding material makes it possible to achieve both the reflection of the electromagnetic wave at the interface and the attenuation of the electromagnetic wave within the layer. The inventors of the present invention conceives this fact is the reason why the electromagnetic wave shielding material is capable of exhibiting high shielding performance against both an electric field wave and a magnetic field wave.

Hereinafter, the electromagnetic wave shielding material will be described in more detail.

<High Magnetic Permeability Layer>

The magnetic permeability of the high magnetic permeability layer (the real part of the complex specific magnetic permeability at a frequency of 100 kHz) is 30 or more. The inclusion of the layer that is an insulating layer having a high magnetic permeability of 30 or more between two metal layers can contribute to the electromagnetic wave shielding material being able to exhibit high shielding performance against a magnetic field wave in addition to the electric field wave. From this point, the magnetic permeability thereof is preferably 40 or more, more preferably 50 or more, still more preferably 60 or more, still more preferably 70 or more, even more preferably 80 or more, even still more preferably 90 or more, and even further still more preferably 100 or more. In addition, the magnetic permeability can be, for example, 200 or less, 190 or less, 180 or less, 170 or less, or 160 or less, and it can exceed the values exemplified here. As the magnetic permeability is higher, the characteristic impedance Zs is larger, and a higher interfacial reflection effect can be obtained, which is preferable.

The high magnetic permeability layer is an insulating layer. This can also contribute to the fact that the electromagnetic wave shielding material is capable of exhibiting high shielding performance against a magnetic field wave in addition to the electric field wave. The electrical conductivity of the high magnetic permeability layer is smaller than 1 S/m, and it is preferably 0.5 S/m or less, more preferably 0.1 S/m or less, and still more preferably 0.05 S/m or less. The electrical conductivity of the high magnetic permeability layer can be, for example, $1.0 \times 10^{-12}$ S/m or more or $1.0 \times 10^{-10}$ S/m or more.

(Magnetic Particle)

The high magnetic permeability layer can contain magnetic particles. In the present invention and the present specification, "magnetic" means having a ferromagnetic property. As the magnetic particle, one kind selected from the group consisting of magnetic particles generally called soft magnetic particles, such as metal particles and ferrite particles, can be used, or two or more kinds therefrom can be used in combination. Since the metal particles generally have a saturation magnetic flux density of about 2 to 3 times as compared with ferrite particles, they can maintain the specific magnetic permeability and exhibit the shielding performance even under a strong magnetic field without magnetic saturation. Therefore, the magnetic particles contained in the high magnetic permeability layer are preferably metal particles.

Metal Particle

In the present invention and the present specification, the "metal particle" includes a pure metal particle consisting of a single metal element, a particle of an alloy of one or more metal elements, one or two more other metal elements, and/or a non-metal element. The metal particle may or may not be crystalline. That is, the metal particle may be a crystalline particle or may be an amorphous particle. Examples of the element of the metal or non-metal contained in the metal particles include Ni, Fe, Co, Mo, Cr, Al, Si, B, and P. The metal particle may or may not contain a component other than the constitutional elements of the metal (including the alloy). The metal particle may contain, in addition to the constitutional element of the metal (including the alloy), elements contained in an additive that can be optionally added and/or elements contained in impurities that can be unintentionally mixed in a manufacturing process of the metal particle at any content. In the metal particle, the content of the constitutional element of the metal (including the alloy) is preferably 90.0% by mass or more and more preferably 95.0% by mass or more, and it may be 100% by mass or may be less than 100% by mass, 99.9% by mass or less, or 99.0% by mass or less.

Examples of the metal particles include particles of Sendust (an Fe—Si—Al alloy), a permalloy (an Fe—Ni alloy), a molybdenum permalloy (an Fe—Ni—Mo alloy), a Fe—Si alloy, a Fe—Cr alloy, an Fe-containing alloy generally called the iron-based amorphous alloy, a Co-containing alloys generally called the cobalt-based amorphous alloy, an alloy generally called the nanocrystal alloy, iron, Permendur (an Fe—Co alloy), and the like. Among them, Sendust is preferable since it exhibits a high saturation magnetic flux density and a high specific magnetic permeability.

Flat-Shaped Particle

From the viewpoint of forming a layer exhibiting a high magnetic permeability as the high magnetic permeability layer, the magnetic particle is preferably a particle having a flat shape (flat-shaped particle). In a case of arranging the long side direction of the flat-shaped particles to be closer to a state parallel to the in-plane direction of the high magnetic permeability layer, it is possible to obtain a higher magnetic permeability since the diamagnetic field can be reduced by aligning the long side direction of the particle with the vibration direction of the electromagnetic wave incident orthogonal to the electromagnetic wave shielding material. In the present invention and the present specification, the "flat-shaped particle" refers to a particle having an aspect ratio of 0.20 or less. The aspect ratio of the flat-shaped particles is preferably 0.15 or less, and more preferably 0.10 or less. The aspect ratio of the flat-shaped particles can be, for example, 0.01 or more, 0.02 or more, or 0.03 or more. It is possible to make the shape of the particle a flat shape by carrying out the flattening process according to a known method. For the flattening process, for example, the description of JP2018-131640A can be referenced, and for example, the description of paragraphs 0016 and 0017 and the description of Examples of the same publication can be referenced. The magnetic particles contained in the high magnetic permeability layer are preferably flat-shaped particles of Sendust.

As described above, from the viewpoint of forming a layer exhibiting a high magnetic permeability as the high magnetic permeability layer, it is preferable to arrange the long side direction of the flat-shaped particles to be closer to a state parallel to the in-plane direction of the high magnetic permeability layer. From this point, the alignment degree which is a sum of an absolute value of an average value of alignment angles of the flat-shaped particles with respect to a surface of the high magnetic permeability layer and a variance of the alignment angles is preferably 30° or lower, more preferably 25° or lower, still more preferably 20° or lower, and particularly preferably 15° or lower. The alignment degree can be, for example, 3° or higher, 5° or higher, or 10° or higher, and it can be lower than the values exemplified here. A method of controlling the alignment degree will be described later.

In the present invention and the present specification, the aspect ratio of the magnetic particle and the alignment degree are determined according to the following methods.

A cross section of a high magnetic permeability layer is exposed according to a known method. A cross-sectional image is acquired as an SEM image regarding a randomly selected region of the cross-section. The imaging conditions are set to be an acceleration voltage of 2 kV and a magnification of 1,000 times, and an SEM image is obtained as the backscattered electron image.

Reading is carried out in gray scale with the cv2 imread( ) function of Image processing library OpenCV 4 (manufactured by Intel Corporation) by setting the second argument to 0, and a binarized image is obtained with the cv2 threshold( ) function, using an intermediate brightness between the high-brightness portion and the low-brightness portion as a boundary. A white portion (high-brightness portion) in the binarized image is defined as a magnetic particle.

Regarding the obtained binarized image, a rotational circumscribed rectangular shape corresponding to a portion of each magnetic particle is determined according to the cv2 minAreaRect( ) function, and the long side length, the short side length, and the rotation angle are determined as the return values of the cv2 minAreaRect( ) function. In a case of determining the total number of magnetic particles included in the binarized image, it shall be assumed that particles in which only a part of the particle is included in the binarized image are also included. Regarding the particles in which only a part of the particle is included in the binarized image, the long side length, the short side length, and the rotation angle of the portion included in the binarized image are determined. The ratio of the short side length to the long side length (short side length/long side length) determined in this way shall be denoted as the aspect ratio of each magnetic particle. In the present invention and the present specification, in a case where the number of magnetic particles which have an aspect ratio of 0.20 or less and is defined as flat-shaped particles is 10% on a number basis with respect to the total number of magnetic particles included in the binarized image, it shall be determined that the high magnetic permeability layer is a "high magnetic permeability layer including flat-shaped particles as the magnetic particles". In addition, from the rotation angle determined as above, an "alignment angle" is determined as a rotation angle with respect to a horizontal plane (the surface of the high magnetic permeability layer).

Particles having an aspect ratio of 0.20 or less, which are determined in the binarized image, are defined as flat-shaped particles. Regarding the alignment angles of all the flat-shaped particles included in the binarized image, the sum of the absolute value of the average value (arithmetic average) and the variance is determined. The sum determined in this way is referred to as the "alignment degree". It is noted that the coordinates of the circumscribed rectangle are calculated using the cv2 boxPoints( ) function, and an image in which the rotation circumscribed rectangular shape is superposed on the original image is created according to the cv2 drawContours( ) function, where a rotational circumscribed rectangular shape that is erroneously detected clearly is excluded from the calculation of the aspect ratio and the alignment degree. In addition, an average value (arithmetic average) of the aspect ratios of the particles defined as the flat-shaped particles shall be denoted as the aspect ratio of the flat-shaped particles contained in a high magnetic permeability layer to be measured. Such an aspect ratio is 0.20 or less, preferably 0.15 or less, and more preferably 0.10 or less. In addition, the aspect ratio can be, for example, 0.01 or more, 0.02 or more, or 0.03 or more.

The content of the magnetic particles in the high magnetic permeability layer is, for example, 50% by mass or more, 60% by mass or more, 70% by mass or more, 72% by mass or more, or 75% by mass or more, and 80% by mass or more with respect to the total mass of the high magnetic permeability layer, and it can be, for example, 100% by mass or less, 98% by mass or less, or 95% by mass or less.

In one form, as the high magnetic permeability layer, a sintered body (a ferrite plate) of ferrite particles or the like can be used. Considering that there is a case where the electromagnetic wave shielding material is cut out to a desired size, a case where the electromagnetic wave shielding material is bent into a desired shape, and the like, the high magnetic permeability layer is preferably a layer contains a resin as compared with a ferrite plate which is a sintered body.

(Resin)

The high magnetic permeability layer can be a layer containing a resin, and it can be a layer containing magnetic particles and a resin. In the high magnetic permeability layer containing the magnetic particles and the resin, the content of the resin can be, for example, 1 part by mass or more, 3 parts by mass or more, or 5 parts by mass or more per 100 parts by mass of the magnetic particles, and it can be 20 parts by mass or less or 15 parts by mass or less.

The resin can act as a binder in the high magnetic permeability layer. In the present invention and the present specification, the "resin" means a polymer, and it shall include rubber and an elastomer as well. The polymer includes a homopolymer and a copolymer. The rubber includes natural rubber and synthetic rubber. The elastomer is a polymer that exhibits elastic deformation. Examples of the resin include known thermoplastic resins in the related art, a thermosetting resin, an ultraviolet curable resin, a radiation curable resin, a rubber-based material, and an elastomer. Specific examples thereof include a polyester resin, a polyethylene resin, a polyvinyl chloride resin, a polyvinyl butyral resin, a polyurethane resin, a cellulose resin, an acrylonitrile-butadiene-styrene (ABS) resin, a nitrile-butadiene rubber, a styrene-butadiene rubber, an epoxy resin, a phenol resin, an amide resin, a styrene-based elastomer, an olefin-based elastomer, a vinyl chloride-based elastomer, a polyester-based elastomer, a polyamide-based elastomer, a polyurethane-based elastomer, and an acrylic elastomer.

The electromagnetic wave shielding material can be used, for example, by being bent into any shape. In a case where the high magnetic permeability layer breaks when the shielding material is bent, the shielding performance may deteriorate at the broken place. Therefore, a high magnetic permeability layer, which has excellent break resistance and is difficult to break during bending, is desirable. From the viewpoint of improving the break resistance of the high magnetic permeability layer, the high magnetic permeability layer is preferably a layer containing a resin having a glass transition temperature Tg of 50° C. or lower. In the present invention and the present specification, the glass transition temperature Tg is determined as the baseline shift start temperature of a heat flow chart at the time of temperature rise from the measurement result of the heat flow measurement using a differential scanning calorimeter. From the viewpoint of further improving the break resistance of the high magnetic permeability layer, the glass transition temperature Tg of the resin contained in the high magnetic permeability layer is more preferably 40° C. or lower, still more preferably 30° C. or lower, even more preferably 20° C. or lower, still more preferably 10° C. or lower, even still more preferably 0° C. or lower, and even further still more preferably −10° C. or lower. The glass transition temperature Tg of the resin contained in the high magnetic permeability layer can be, for example, −100° C. or higher, −90° C. or higher, or −80° C. or higher.

In addition to the above-described components, the high magnetic permeability layer can also contain any amount of one or more known additives such as a curing agent, a dispersing agent, a stabilizer, and a coupling agent.

<Metal Layer>

The electromagnetic wave shielding material includes the high magnetic permeability layer between the two metal layers. The electromagnetic wave shielding material includes one or more and can also include two or more multilayer structures having the high magnetic permeability layer between the two metal layers. That is, the electromagnetic wave shielding material includes at least two metal layers and can also include three or more metal layers, or it includes at least one layer of the high magnetic permeability layer and can also include two or more layers of the high magnetic permeability layer. The two or three or more metal layers included in the electromagnetic wave shielding material have the same composition and thickness in one form and differ in composition and/or thickness in the other form. In addition, in a case where the electromagnetic wave shielding material includes two or more layers of the high magnetic permeability layer, the two or more high magnetic permeability layers have the same composition and thickness in one form and differ in composition and/or thickness in the other form.

Specific examples of the layer configuration of the electromagnetic wave shielding material include "metal layer/high magnetic permeability layer/metal layer", "metal layer/high magnetic permeability layer/metal layer/high magnetic permeability layer/metal layer", and "metal layer"/high magnetic permeability layer/metal layer/high magnetic permeability layer/metal layer/high magnetic permeability layer/metal layer". In the above, the symbol "/" is used in the sense of including both the fact that the layer described on the left side and the layer described on the right side of this symbol are in direct contact with each other without another layer being interposed therebetween and that they are indirectly laminated with one or more layer other layers being interposed therebetween. Specific examples of the other layer include a double-sided tape and an adhesive, which is for adhesion described later.

As the metal layer, a layer containing one or more kinds of metals selected from the group consisting of various pure metals and various alloys can be used. The metal layer can exhibit an attenuation effect in the shielding material. Since the attenuation effect increases as the propagation constant increases and the propagation constant increases as the electrical conductivity increases, it is preferable that the metal layer contains a metal element having a high electrical conductivity. From this point, it is preferable that the metal layer contains a pure metal of Ag, Cu, Au, or Al, or an alloy containing any one of these as a main component. The pure metal is a metal consisting of a single metal element and may contain a trace amount of impurities. In general, a metal having a purity of 99.0% or more consisting of a single metal element is called a pure metal. The purity is based on mass. The alloy is generally prepared by adding one or more kinds of metal elements or non-metal elements to a pure metal to adjust the composition, for example, in order to prevent corrosion or improve the hardness. The main component in the alloy is a component having the highest ratio on a mass basis, and it can be, for example, a component that occupies 80.0% by mass or more (for example, 99.8% by mass or less) in the alloy. From the viewpoint of economic efficiency, the alloy is preferably an alloy of a pure metal of Cu or Al or an alloy containing Cu or Al as a main component, and from the viewpoint of high electrical conductivity, it is preferably an alloy of a pure metal of Cu or an alloy containing Cu as a main component.

The purity of the metal in the metal layer, that is, the content of the metal can be 99.0% by mass or more, preferably 99.5% by mass or more, and more preferably 99.8% by mass or more with respect to the total mass of the metal layer. Unless otherwise specified, the content of metal in the metal layer shall refer to the content on a mass basis. For example, as the metal layer, a pure metal or an alloy processed into a sheet shape can be used. For example, regarding a pure metal of Cu, sheets (so-called copper foils) having various thicknesses are commercially available. For example, such a copper foil can be used as the metal layer. The copper foil includes, according to manufacturing methods thereof, an electrolytic copper foil obtained by precipitating a copper foil on a cathode by electroplating and a rolled copper foil obtained by applying heat and pressure to an ingot and stretching the ingot thinly. Any copper foil can be used as the metal layer of the electromagnetic wave shielding material. In addition, for example, regarding Al, sheets (so-called aluminum foils) having various thicknesses are commercially available. For example, such an aluminum foil can be used as the metal layer.

From the viewpoint of reducing the weight of the electromagnetic wave shielding material, one or both (preferably both) of the two metal layers included in the multilayer structure is preferably a metal layer containing a metal selected from the group consisting of Al and Mg. This is because a value (specific gravity/electrical conductivity) obtained by dividing the specific gravity by the electrical conductivity is small both in Al and Mg. As a metal in which this value is smaller is used, the weight of the electromagnetic wave shielding material exhibiting high shielding performance can be further reduced. As a value calculated from the literature value, for example, a value (specific gravity/electrical conductivity) obtained by dividing the specific gravity by the electrical conductivity of each of Cu, Al, and Mg is as follows. Cu: $1.5 \times 10^{-7}$ m/S, Al: $7.6 \times 10^{-8}$ m/S, Mg: $7.6 \times 10^{-8}$ m/S. From the above values, it can be said that Al and Mg are preferred metals from the viewpoint of reducing the weight of the electromagnetic wave shielding material. The metal layer containing a metal selected from the group consisting of Al and Mg can contain only one of Al and Mg in one form and can contain both in the other form. From the viewpoint of reducing the weight of the electromagnetic wave shielding material, one or both (preferably both) of the two metal layers included in the multilayer structure are preferably a metal layer in which the content of the metal selected from the group consisting of Al and Mg is 80.0% by mass, and still more preferably a metal layer in which the content of the metal selected from the group consisting of Al and Mg is 90.0% by mass. The metal layer containing at least Al among Al and Mg can be a metal layer in which the Al content is 80.0% by mass or more, and it can be a metal layer in which the Al content is 90.0% by mass or more. The metal layer containing at least Mg among Al and Mg can be a metal layer in which the Mg content is 80.0% by mass or more, and it can be a metal layer in which the Mg content is 90.0% by mass or more. Each of the content, Al content, and Mg content of the metal selected from the group consisting of Al and Mg can be, for example, 99.9% by mass or less. Each of the content, Al content, and Mg content of the metal selected from the group consisting of Al and Mg is the content with respect to the total mass of the metal layer.

<Various Thickness>

From the viewpoint of the workability of the metal layer and the shielding performance of the electromagnetic wave shielding material, the thickness of the metal layer in terms of the thickness per one layer is preferably 4 μm or more, more preferably 5 μm or more, still more preferably 10 μm or more per layer, even more preferably 15 μm or more, even still more preferably 20 μm or more, and even still more preferably 25 μm or more. On the other hand, from the viewpoint of the processability of the metal layer, the thickness of the metal layer in terms of the thickness per one layer is preferably 100 μm or less, more preferably 50 μm or less, still more preferably 45 μm or less, and even still more preferably 40 μm or less.

In a case where the thickness of one metal layer of the two metal layers that are positioned to sandwich the high magnetic permeability layer is denoted as T1, the thickness of the other metal layer is denoted as T2, and T1 is equal to or larger than T2 (that is, T1=T2 or T1>T2), the ratio (T2/T1) of the thickness between the two metal layers can be, for example, 0.10 or more, and it is preferably 0.15 or more, more preferably 0.30 or more, still more preferably 0.50 or more, even more preferably 0.70 or more, and even still more preferably 0.80 or more, from the viewpoint that higher shielding performance can be exhibited with respect to the magnetic field wave. From the viewpoint that still higher shielding performance can be exhibited with respect to the magnetic field wave, It is preferable that the difference between T1 and T2 is smaller. The thickness ratio (T2/T1) can be 1.00 or less and can also be 1.00 (that is, T1=T2). In a case where the electromagnetic wave shielding material includes a multilayer structure having the high magnetic permeability layer between two metal layers, the above description regarding the thickness ratio (T2/T1) can be applied to at least one of the multilayer structures included in the electromagnetic wave shielding material, can be applied to two or more of them, and can be applied to all of them.

The shielding material can be processed by being bent into any shape according to a use application. In a case where the width of the curved portion (hereinafter, referred to as a "curve width") is widened when the shielding material is bent, the shape of the curved portion becomes a gentle curve shape, and it may be difficult to process the shielding material into an intended shape. From this point, the narrower the curve width is, the more preferable it is, and the curve width is, for example, preferably 2.20 mm or less, more preferably 2.00 mm or less, and still more preferably 1.50 mm or less. The larger the total thickness of the metal layers included in the shielding material is, the wider the curve width tends to be. From the viewpoint of making the curve width of the shielding material narrow, the total thickness of the metal layers included in the electromagnetic wave shielding material is preferably 100 μm or less, more preferably 90 μm or less, still more preferably 80 μm or less, even more preferably 70 μm or less, even still more preferably 60 μm or less, and even further still more preferably 50 μm or less, and even further still more preferably 40 μm or less. The total thickness of the metal layers included in the electromagnetic wave shielding material can be, for example, 8 μm or more or 10 μm or more. The total number of metal layers included in the electromagnetic wave shielding material is 2 or more layers, and it can be, for example, 2 to 5 layers.

Regarding the thickness of the high magnetic permeability layer, the thickness per layer can be, for example, 3 μm or more, and it is preferably 10 μm or more and more preferably 20 μm or more, from the viewpoint of the shielding performance of the electromagnetic wave shielding material. In addition, from the viewpoint of processability of the electromagnetic wave shielding material, the thickness of the high magnetic permeability layer per layer can be, for example, 90 μm or less, and it is preferably 70 μm or less and more preferably 50 μm or less. In a case where the electromagnetic wave shielding material includes two or more layers of the high magnetic permeability layers, the total thickness of the high magnetic permeability layers included in the electromagnetic wave shielding material can be, for example, 6 μm or more and it can be, for example, 180 μm or less. The total number of the high magnetic permeability layers included in the electromagnetic wave shielding material is 1 or more layers, and it can be, for example, 1 to 4 layers.

In addition, the overall thickness of the shielding material can be, for example, 250 μm or less. From the viewpoint of making the curve width narrow, it is also preferable that the overall thickness of the shielding material is small. From this point, the overall thickness of the electromagnetic wave shielding material is preferably 200 μm or less, more preferably 190 μm or less, and still more preferably 170 μm or less. The overall thickness of the electromagnetic wave shielding material can be, for example, 30 μm or more or 40 μm or more.

<Manufacturing Method for Electromagnetic Wave Shielding Material>

(Method of Forming Film of High Magnetic Permeability Layer)

The high magnetic permeability layer can be produced, for example, by drying a coating layer that is proved by applying a composition for forming a high magnetic permeability layer. The composition for forming a high magnetic permeability layer contains the components described above and can optionally contain one or more kinds of solvents. Examples of the solvent include various organic solvents, for example, ketone-based solvents such as acetone, methyl ethyl ketone, and cyclohexanone, acetic acid ester-based solvent solvents such as ethyl acetate, butyl acetate, cellosolve acetate, propylene glycol monomethyl ether acetate, and carbitol acetate, carbitols such as cellosolve and butyl carbitol, aromatic hydrocarbon-based solvents such as toluene and xylene, and amide-based solvents such as dimethylformamide, dimethylacetamide, and N-methylpyrrolidone. One kind of solvent or two or more kinds of solvents selected in consideration of the solubility of the component that is used in the preparation of the composition for forming a high magnetic permeability layer can be mixed at any ratio and used. The solvent content of the composition for forming a high magnetic permeability layer is not particularly limited and may be determined in consideration of the coatability of the composition for forming a high magnetic permeability layer.

The composition for forming a high magnetic permeability layer can be prepared by sequentially mixing various components in any order or simultaneously mixing them. In addition, as necessary, a dispersion treatment can be carried out using a known dispersing machine such as a ball mill, a bead mill, a sand mill, or a roll mill, and/or a stirring treatment can be also carried out using a known stirrer such as a shaking type stirrer.

The composition for forming a high magnetic permeability layer can be applied onto, for example, a support. The coating can be carried out using a known coating device such as a blade coater or a die coater. The coating can be carried out by a so-called roll-to-roll method or a batch method.

Examples of the support onto which the composition for forming a high magnetic permeability layer is applied include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide. For these resin films, reference can be made to paragraphs 0081 to 0086 of JP2015-187260A. As the support, it is possible to use a support in which a surface (a surface to be coated) onto which the composition for forming a high magnetic permeability layer is applied is subjected to a peeling treatment according to a known method. One form of the peeling treatment includes forming a release layer. For the release layer, reference can be made to paragraph 0084 of JP2015-187260A. In addition, a commercially available peeling-treated resin film can also be used as the support. In a case of using a support in which the surface to be coated is subjected to the peeling treatment, it is possible to easily separate the high magnetic permeability layer and the support after the film formation.

In one form, it is also possible to directly apply the composition for forming a high magnetic permeability layer onto the metal layer using the metal layer as a support. In a case of directly applying the composition for forming a high magnetic permeability layer onto the metal layer, it is possible to manufacture a laminated structure of the metal layer and the high magnetic permeability layer in one step.

A coating layer formed by applying the composition for forming a high magnetic permeability layer can be subjected to a drying treatment according to a known method such as heating or warm air blowing. The drying treatment can be carried out, for example, under conditions in which the solvent contained in the composition for forming a high magnetic permeability layer can be volatilized. As an example, the drying treatment can be carried out for 1 minute to 2 hours in a heated atmosphere having an atmospheric temperature of 80° C. to 150° C.

The alignment degree of the flat-shaped particle described above can be controlled by a solvent kind, solvent amount, liquid viscosity, coating thickness, and the like of the composition for forming a high magnetic permeability layer. For example, in a case where the boiling point of the solvent is low, convection occurs due to drying, and thus the value of the alignment degree tends to be large. In a case where the solvent amount is small, the value of the alignment degree tends to increase due to physical interference between adjacent flat-shaped particles. On the other hand, in a case where the liquid viscosity is low, the rotation of flat-shaped particles is difficult to occur, and thus the value of the alignment degree tends to be small. The value of the alignment degree tends to be small as the coating thickness decreases. In addition, carrying out a pressurization treatment described later can contribute to reducing the value of the alignment degree. In a case of adjusting the various manufacturing conditions described above, the alignment degree of the flat-shaped particles can be controlled within the range described above.

(Pressurization Treatment of High Magnetic Permeability Layer)

The high magnetic permeability layer can also be subjected to a pressurization treatment after film formation. In a case of subjecting the high magnetic permeability layer containing the magnetic particles to a pressurization treatment, it is possible to increase the density of the magnetic particles in the high magnetic permeability layer, and it is possible to obtain a higher magnetic permeability. In addition, in the high magnetic permeability layer containing the flat-shaped particles, it is possible to reduce the value of the alignment degree by the pressurization treatment, and it is possible to obtain a higher magnetic permeability.

The pressurization treatment can be carried out by applying pressure in the thickness direction of the high magnetic permeability layer using a flat plate pressing machine, a roll pressing machine, or the like. In the flat plate pressing machine, an object to be pressed is disposed between two flat press plates that are disposed vertically, and the two press plates are put together by mechanical or hydraulic pressure to apply pressure to the object to be pressed. In the roll pressing machine, an object to be pressurized is allowed to pass between the rotating pressurization rolls that are disposed vertically, and at that time, mechanical or hydraulic pressure is applied to the pressurization rolls, or the distance between the pressurization rolls is made to be smaller than the thickness of the object to be pressed, whereby the pressure can be applied.

The pressure during the pressurization treatment can be set freely. For example, in a case of a flat plate pressing machine, it is, for example, 1 to 50 newton (N)/mm². In a case of a roll pressing machine, it is, for example, 20 to 400 N/mm in terms of the linear pressure.

The pressurization time can be set freely. It takes, for example, 5 seconds to 30 minutes in a case where a flat plate pressing machine is used. In a case where a roll pressing machine is used, the pressurization time can be controlled by the transport speed of the object to be pressed, where the transport speed is, for example, 10 cm/min to 200 m/min.

The materials of the press plate and the pressurization roll can be randomly selected from metal, ceramics, plastic, and rubber.

In the pressurization treatment, it is also possible to carry out a pressurization treatment by applying a temperature to both of upper and lower press plates of a plate-shape pressing machine or one press plate thereof, or one roll of upper and lower rolls of a roll pressing machine. The high magnetic permeability layer can be softened by heating, which makes it possible to obtain a high compression effect in a case where pressure is applied. The temperature at the time of heating can be set freely, and it is, for example, 50° C. or higher and 200° C. or lower. The temperature at the time of heating can be the internal temperature of the press plate or the roll. Such a temperature can be measured with a thermometer installed inside the press plate or the roll.

After the heating and pressurization treatment with the plate-shape pressing machine, the press plates can be spaced apart from each other, for example, in a state where the temperature of the press plates is high, whereby the high magnetic permeability layer can be taken out. Alternatively, the press plate can be cooled by a method such as water cooling or air cooling while maintaining the pressure, and then the press plates can be spaced apart to take out the high magnetic permeability layer.

In the roll pressing machine, the high magnetic permeability layer can be cooled immediately after pressing, by a method such as water cooling or air cooling.

It is also possible to repeat the pressurization treatment two or more times.

In a case where the high magnetic permeability layer is formed into a film on a release film, it is possible to carry out a pressurization treatment in a state where the high magnetic permeability layer is laminated on the release film. Alternatively, the high magnetic permeability layer can also be peeled off from the release film and can be subjected to a pressurization treatment as a single layer of the high magnetic permeability layer. In a case where the high magnetic permeability layer is formed into a film directly on the metal layer, the pressurization treatment can be carried out in a state where the metal layer and the high magnetic permeability layer are superposed. In addition, in a case of carrying out the pressurization treatment in a state where the high magnetic permeability layer is disposed between the metal layers, it is also possible to carry out the pressurization treatment of the high magnetic permeability layer and the adhesion between the metal layer and the high magnetic permeability layer at the same time.

(Bonding of Metal Layer and High Magnetic Permeability Layer)

The metal layer and the high magnetic permeability layer can be directly bonded to each other, for example, by applying pressure and heat to carry out crimping. A flat plate pressing machine, a roll pressing machine, or the like can be used for the crimping. In the crimping step, the high magnetic permeability layer is softened, and the contact with the surface of the metal layer is promoted, whereby the metal layer and the high magnetic permeability layer can be adhered to each other. The pressure at the time of crimping can be set freely. It is, for example, 1 to 50 N/mm$^2$ in a case of a flat plate pressing machine. In a case of a roll pressing machine, it is, for example, 20 to 400 N/mm in terms of the linear pressure. The pressurization time at the time of crimping can be set freely. It takes, for example, 5 seconds to 30 minutes in a case where a flat plate pressing machine is used. In a case where a roll pressing machine is used, the pressurization time can be controlled by a transport speed of an object to be pressed, and the transport speed is, for example, 10 cm/min to 200 m/min. The temperature at the time of crimping can be randomly selected. For example, it is 50° C. or higher and 200° C. or lower.

The metal layer and the high magnetic permeability layer can also be bonded by interposing a pressure-sensitive adhesive layer and/or an adhesive layer between layers of the metal layer and the magnetic layer.

In the present invention and the present specification, the "pressure-sensitive adhesive layer" refers to a layer having tackiness on a surface at normal temperature. Here, the "normal temperature" shall be defined as 23° C., and the normal temperature, which will be described later in association with the adhesive layer, shall be also defined as 23° C. In a case where such a layer comes into contact with an adherend, the layer adheres to the adherend due to the adhesive force thereof. In general, the tackiness is the property of exhibiting an adhesive force in a short time after coming into contact with an adherend with a very light force, and in the present invention and the present specification, the above-described "having tackiness" refers to that the result is No. 1 to No 32 in a tilted ball tack test (measurement environment: a temperature of 23° C. and a relative humidity of 50%) specified in JIS Z 0237: 2009. In a case where another layer is laminated on the surface of the pressure-sensitive adhesive layer, the surface of the pressure-sensitive adhesive layer exposed, for example, by peeling off the other layer can be subjected to the above-described test. In a case where another layer is laminated on each of one surface and the other surface of the pressure-sensitive adhesive layer, the layer on the side of either surface may be peeled off.

As the pressure-sensitive adhesive layer, it is possible to use those obtained by applying a composition for forming a pressure-sensitive adhesive layer containing a pressure sensitive adhesive such as an acrylic pressure-sensitive adhesive, a rubber-based pressure-sensitive adhesive, a silicone-based pressure-sensitive adhesive, or a urethane-based pressure-sensitive adhesive is applied and processing it into a film shape.

The composition for forming a pressure-sensitive adhesive layer can be applied onto, for example, a support. The coating can be carried out using a known coating device such as a blade coater or a die coater. The coating can be carried out by a so-called roll-to-roll method or a batch method.

Examples of the support onto which the composition for forming a pressure-sensitive adhesive layer is applied include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide. As the support, it is possible to use a support in which a surface (a surface to be coated) onto which the composition for forming a pressure-sensitive adhesive layer is applied is subjected to a peeling treatment according to a known method. One form of the peeling treatment includes forming a release layer. In addition, a commercially available peeling-treated resin film can also be used as the support. In a case of using a support in which the surface to be coated is subjected to the peeling treatment, it is possible to easily separate the pressure-sensitive adhesive layer and the support after the film formation.

A composition for forming a pressure-sensitive adhesive layer, in which a pressure-sensitive adhesive is dissolved and/or dispersed in a solvent, is applied to a metal layer or a high magnetic permeability layer and dried, whereby a pressure-sensitive adhesive layer is laminated on the surface of the metal layer or the high magnetic permeability layer.

In addition, a film-shaped pressure-sensitive adhesive layer is superposed with a metal layer or a high magnetic permeability layer and pressurized, whereby the pressure-sensitive adhesive layer can be laminated on the surface of the metal layer or the high magnetic permeability layer.

A pressure-sensitive pressure-sensitive adhesive tape including an adhesive layer can also be used for producing an electromagnetic wave shielding material having a pressure-sensitive adhesive layer. As the pressure-sensitive pressure-sensitive adhesive tape, it is possible to use a double-sided tape. In the double-sided tape, pressure-sensitive adhesive layers are respectively provided on both sides of the support, and the pressure-sensitive adhesive layers on both sides can each have tackiness at normal temperature. In addition, as the pressure-sensitive adhesive tape, it is possible to use a pressure-sensitive adhesive tape in which a pressure-sensitive adhesive layer is provided on one surface of a support. Examples of the support include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide, a non-woven fabric, and paper. As the pressure-sensitive pressure-sensitive adhesive tape in which the pressure-sensitive adhesive layer is provided on one surface or both surfaces of a support, it is possible to use a commercially available product, or it is possible to use a double-sided tape produced by a known method.

In the present invention and the present specification, the "adhesive layer" shall refer to a layer having no tackiness on a surface at normal temperature, where the layer flows and follows minute protrusions and recessions on the surface of the adherend by being pressed against the adherend in a state of being heated, thereby exhibiting an adhesive force by the anchoring effect, or generates a chemical bond with the surface of the adherend by a chemical reaction by being pressed against the adherend in a state of being heated, thereby exhibiting an adhesive force. The adhesive layer can be softened and/or undergo a chemical reaction by heating. The above-described "having no tackiness" refers to that the ball of No. 1 does not stop in a tilted ball tack test (measurement environment: a temperature of 23° C. and a relative humidity of 50%) specified in JIS Z 0237: 2009. In a case where another layer is laminated on the surface of the adhesive layer, the surface of the adhesive layer exposed, for example, by peeling off the other layer can be subjected to the above-described test. In a case where another layer is laminated on each of one surface and the other surface of the adhesive layer, the layer on the side of either surface may be peeled off.

A film-shaped resin material can be used as the adhesive layer. A thermoplastic resin and/or a thermosetting resin can be used as the resin material. The thermoplastic resin has the property of being softened by heating and flows and follows minute protrusions and recessions on the surface of the adherend by being pressed against the adherend in a state of being heated, thereby capable of exhibiting an adhesive force due to the anchoring effect, and then it is cooled, whereby the adhered state can be maintained. The thermosetting resin can cause a chemical reaction by heating, where the chemical reaction occurs by heating in a state of being in contact with an adherend, and a chemical bond is formed with the surface of the adherend, whereby an adhesive force can be exhibited.

Examples of the thermoplastic resin include polyethylene (PE), polypropylene (PP), polyvinyl chloride (PVC), polystyrene (PS), polyvinyl acetate, polyurethane, polyvinyl alcohol, an ethylene vinyl acetate copolymer, styrene butadiene rubber, acrylonitrile butadiene rubber, silicone rubber, an olefin-based elastomer (PP), a styrene-based elastomer, an ABS resin, polyethylene terephthalate (PET), polyester such as polyethylene naphthalate (PEN), polycarbonate (PC), an acryl such as polymethyl methacrylate (PMMA), cyclic polyolefin, and triacetyl cellulose (TAC).

Examples of the thermosetting resin include an epoxy resin, a phenol resin, a melamine resin, a thermosetting urethane resin, a xylene resin, and a thermosetting silicone resin.

In a case where the adhesive layer contains a resin having the same main polymer skeleton as the resin contained in the high magnetic permeability layer, the compatibility between the resin contained in the high magnetic permeability layer and the resin contained in the adhesive layer is increased, which is preferable from the viewpoint of the adhesion between the high magnetic permeability layer and the adhesive layer. For example, it is preferable that the high magnetic permeability layer contains a polyurethane resin and the adhesive layer also contains the polyurethane resin.

The film-shaped resin material used as the adhesive layer may be a commercially available product or may be a film-shaped resin material produced by a known method.

In one form, a resin or resin precursor dissolved and/or dispersed in a solvent is applied onto the metal layer or the high magnetic permeability layer and cured by drying or polymerization, whereby an adhesive layer consisting of a film-shaped resin material can be laminated on the surface of the metal layer or the high magnetic permeability layer.

Alternatively, a resin or resin precursor dissolved and/or dispersed in a solvent is applied onto a support and cured by drying or polymerization to form an adhesive layer, which is subsequently peeled off from the support, whereby a film-shaped adhesive layer can be formed.

A film-shaped adhesive layer is superposed with a metal layer or a high magnetic permeability layer and pressurized under heating, whereby the adhesive layer can be laminated on the surface of the metal layer or the high magnetic permeability layer.

In a case where the high magnetic permeability layer as an adherend is pressurized under heating in a state of being superposed with an adhesive layer of the metal layer having a surface on which the adhesive layer is laminated, it is possible to bond the metal layer and the high magnetic permeability layer to each other with the adhesive layer being interposed therebetween.

Alternatively, in a case where the metal layer as an adherend is pressurized under heating in a state of being superposed with an adhesive layer of the high magnetic permeability layer having a surface on which the adhesive layer is laminated, it is possible to bond the metal layer and the high magnetic permeability layer to each other with the adhesive layer being interposed therebetween.

Alternatively, in a case where the metal layer and the high magnetic permeability layer are superposed and pressurized under heating with an adhesive layer which is a film-shaped resin material being provided therebetween, it is possible to bond the metal layer and the high magnetic permeability layer to each other with the adhesive layer being interposed therebetween.

The pressurization under heating can be carried out with a flat plate pressing machine, a roll pressing machine, or the like, which has a heating mechanism.

In addition, examples of the adhesive means also include the double-sided tape described as a silicone-based base material-less double-sided tape in JP2003-20453A.

In a general pressure-sensitive adhesive layer and a general adhesive layer, the electrical conductivity is extremely small as compared with the metal layer, the magnetic permeability is extremely small as compared with the high magnetic permeability layer, and the relative permittivity is only about several times that of air, and the characteristic impedance and the propagation constant are similar to those of air. Therefore, the use of the general adhesive layer and/or adhesive layer does not affect the shielding performance of the shielding material, or the effect thereof is as small as negligible. Regarding the pressure-sensitive adhesive layer and the adhesive layer, the thickness per layer is not particularly limited and can be, for example, 1 μm or more and 30 μm or less.

In one form, the electromagnetic wave shielding material can be produced through one or more of the following steps. The manufacturing method for the electromagnetic wave shielding material is not particularly limited.

The bonding of the metal layer to the high magnetic permeability layer is carried out by using a pressure-sensitive adhesive layer or an adhesive layer, which is formed in a film shape.

The bonding of the metal layer to the high magnetic permeability layer is carried out, by forming a high magnetic permeability layer in which a pressure-sensitive adhesive layer or an adhesive layer has been provided on the surface and bonding this high magnetic permeability layer and the metal layer by interposing the pressure-sensitive adhesive layer or the adhesive layer.

The bonding of the metal layer to the high magnetic permeability layer is carried out, by forming a metal layer in which a pressure-sensitive adhesive layer or an adhesive layer has been provided on the surface and bonding this metal layer and the high magnetic permeability layer by interposing the pressure-sensitive adhesive layer or the adhesive layer.

The pressure-sensitive adhesive layer or the adhesive layer is directly provided by coating on the surface of the metal layer or the high magnetic permeability layer.

The pressure-sensitive adhesive layer or the adhesive layer is provided by coating on a release film and crimped to the high magnetic permeability layer by applying pressure or crimped to the high magnetic permeability layer by applying heat and pressure, and then the release film is peeled off to form a high magnetic permeability layer having a pressure-sensitive adhesive layer or an adhesive layer on the surface.

The pressure-sensitive adhesive layer or the adhesive layer is provided by coating on a release film and crimped to the high magnetic permeability layer by applying pressure or crimped to the metal layer by applying heat and pressure, and then the release film is peeled off to form a metal layer having a pressure-sensitive adhesive layer or an adhesive layer on the surface.

The electromagnetic wave shielding material can have any shape such as a film shape (also referred to as a sheet shape) and any size. For example, a film-shaped electromagnetic wave shielding material can be bent into any shape and incorporated into an electronic component or an electronic apparatus.

[Electronic Component]

One aspect of the present invention relates to an electronic component including the electromagnetic wave shielding material. Examples of the electronic component include an electronic component included in an electronic apparatus such as a mobile phone, a mobile information terminal, and a medical device, and various electronic components such as a semiconductor element, a capacitor, a coil, and a cable. The electromagnetic wave shielding material can be bent into any shape, for example, according to the shape of the electronic component, thereby capable of being disposed inside the electronic component or capable of being disposed as a cover material that covers the outside of the electronic component. Alternatively, it can be processed into a tubular shape and disposed as a cover material that covers the outside of the cable.

[Electronic Apparatus]

One aspect of the present invention relates to an electronic apparatus including the electromagnetic wave shielding material. Examples of the electronic apparatus include electronic apparatuses such as a mobile phone, a mobile information terminal, and a medical device, electronic apparatuses including various electronic components such as a semiconductor element, a capacitor, a coil, and a cable, and electronic apparatuses in which electronic components are mounted on a circuit board. Such an electronic apparatus can include the electromagnetic wave shielding material as a constitutional member of an electronic component included in the device. In addition, as a constitutional member of the electronic apparatus, the electromagnetic wave shielding material can be disposed inside the electronic apparatus or can be disposed as a cover material that covers the outside of the electronic apparatus. Alternatively, it can be processed into a tubular shape and disposed as a cover material that covers the outside of the cable.

Examples of the usage form of the electromagnetic wave shielding material include a usage form in which a semiconductor package on a printed board is coated with a shielding material. For example, "Electromagnetic wave shielding technology in a semiconductor package" (Toshiba Review Vol. 67, No. 2 (2012) P. 8) discloses a method of obtaining a high shielding effect by electrically connecting a side via of an end part of a package substrate and an inner surface of a shielding material in a case where a semiconductor package is coated with a shielding material, thereby carrying out ground wiring. In order to carry out such wiring, it is desirable that the outermost layer of the shielding material on the electronic component side is a metal layer. Since the electromagnetic wave shielding material includes one or more multilayer structures having the high magnetic permeability layer between the two metal layers, and one or both outermost layers of the shielding material can be a metal layer, the electromagnetic wave shielding material can be suitably used in a case of carrying out the wiring as described above.

EXAMPLES

Hereinafter, the present invention will be described in more detail with reference to Examples. However, the present invention is not limited to the embodiments shown in Examples.

Example 1

<Preparation of Coating Liquid>

To a plastic bottle, the following substances were added and mixed with a shaker-type stirrer for 1 hour to prepare a coating liquid;

Fe—Si—Al flat-shaped magnetic particles (Sendust MFS-SUH manufactured by MKT): 100 g, a polystyrene polybutadiene block copolymer (manufactured by Sigma-Aldrich Japan): 12 g, and cyclohexanone: 205 g.

<Production of Magnetic Particle-Containing Layer (High Magnetic Permeability Layer)>

(Formation of Film of Magnetic Particle-Containing Layer)

A coating liquid was applied onto a peeling surface of a peeling-treated PET film (PET75TR manufactured by NIPPA Co., Ltd., hereinafter also described as a "release film") with a blade coater having a coating gap of 300 μm and dried for 30 minutes in a drying device having an internal atmospheric temperature of 80° C. to form a film of a film-shaped magnetic particle-containing layer.

(Pressurization Treatment of Magnetic Particle-Containing Layer)

Upper and lower press plates of a plate-shape pressing machine (a large-scale hot press TA-200-1 W manufactured by YAMAMOTO ENG. WORKS Co., LTD.) were heated to 140° C. (the internal temperature of the press plate), and the magnetic particle-containing layer on the release film was installed in the center of the press plate together with the release film and held for 10 minutes in a state where a pressure of 4.66 N/mm² was applied. The upper and lower press plates were cooled to 50° C. (the internal temperature of the press plates) while maintaining the pressure, and then the magnetic particle-containing layer was taken out together with the release film.

<Formation of Shielding Material>

A part of the magnetic particle-containing layer after the release film was peeled off was cut out and used as a sample piece for the following measurement of magnetic permeability, measurement of electrical conductivity, and evaluation of break resistance. A double-sided tape (NeoFix 5 S2 manufactured by NEION Film Coatings Corp.) having a thickness of 5 μm was bonded to the upper and lower surfaces of the magnetic particle-containing layer after the sample piece had been cut out, and a copper foil having a thickness of 10 μm (conforming to the JIS H3100: 2018 standard, alloy number: C1100R, copper content: 99.90% by mass or more) was further bonded to the upper and lower surfaces.

In this way, an electromagnetic wave shielding material of Example 1 was obtained. The shielding material of Example 1 includes a multilayer structure of "copper foil/magnetic particle-containing layer (high magnetic permeability layer)/copper foil".

<Measurement of Magnetic Permeability>

The magnetic particle-containing layer was cut into a rectangular shape having a size of 28 mm×10 mm, the magnetic permeability was measured using a magnetic permeability measuring apparatus (PER01 manufactured by KEYCOM Corporation), and the magnetic permeability was determined as the real part ($μ'$) of the complex specific magnetic permeability at a frequency of 100 kHz.

<Measurement of Electrical Conductivity>

A cylindrical main electrode having a diameter of 30 mm was connected to the negative electrode side of a digital super-insulation resistance meter (TR-811A manufactured by Takeda RIKEN Industries), a ring electrode having an inner diameter of 40 mm and an outer diameter of 50 mm was connected to the positive electrode side thereof, the main electrode was installed on a sample piece of the magnetic particle-containing layer cut to a size 60 mm×60 mm, the ring electrode was installed at a position surrounding the main electrode, a voltage of 25 V was applied to both electrodes, and the surface electrical resistivity of the magnetic particle-containing layer alone was measured. The electrical conductivity of the magnetic particle-containing layer was calculated from the surface electrical resistivity and the following expression. As the thickness, the thickness of the magnetic particle-containing layer, which had been determined by the following method, was used.

$$\text{Electrical conductivity [S/m]}=1/(\text{surface electrical resistivity [Ω]}\times\text{thickness [m]})$$

<Acquisition of Cross-Sectional Image of Shielding Material>

Cross-section processing was carried out to expose the cross-section of the shielding material by the following method.

A shielding material cut out to a size of 3 mm×3 mm was embedded in a resin, and a cross section of the shielding material was cut with an ion milling device (IM4000PLUS manufactured by Hitachi High-Tech Corporation).

The cross-section of the shielding material, which had been exposed in this way, was observed with a scanning electron microscope (SU8220, manufactured by Hitachi High-Tech Corporation) under the conditions of an acceleration voltage of 2 kV and a magnification of 100 times to obtain a backscattered electron image. From the obtained image, the thicknesses of the magnetic particle-containing layer, each of the two metal layers, and the entire shielding material were measured based on the scale bar at five points, and the arithmetic averages of the respective thicknesses were denoted as the thickness of the magnetic particle-containing layer, the thickness of each of the two metal layers, and the overall thickness of the shielding material.

<Acquisition of Cross-Sectional Image of Magnetic Particle-Containing Layer (High Magnetic Permeability Layer)>

In a cross section of the shielding material exposed by the cross-section processing in the same manner as described above, a portion of the magnetic particle-containing layer was observed with a scanning electron microscope (SU8220, manufactured by Hitachi High-Tech Corporation) under the conditions of an acceleration voltage of 2 kV and a magnification of 1,000 times, thereby obtaining a backscattered electron image.

<Measurement of Aspect Ratio of Magnetic Particle and Alignment Degree of Flat-Shaped Particle>

Using the backscattered electron image acquired as above, the aspect ratio of the magnetic particles was determined according to the method described above, and the flat-shaped particles were specified from the value of the aspect ratio. Whether or not the magnetic particle-containing layer contained the flat-shaped particles as the magnetic particles was determined as described above. A case where it was determined that the flat-shaped particles were contained was described as "Containing flat-shaped particles" in Table 1, and A case where it was determined that the flat-shaped particles were not contained was described as "Not containing" in Table 1. In a case where it was determined to contain the flat-shaped particles, the alignment degree of the magnetic particles specified as the flat-shaped particles was determined according to the method described above. In addition, an average value (arithmetic average) of the aspect ratios of all the particles specified as the flat-shaped particles was denoted as the aspect ratio of the flat-shaped particles contained in the magnetic particle-containing layer.

<Magnetic Particle Content of Magnetic Particle-Containing Layer (High Magnetic Permeability Layer)>

The content of the magnetic particles with respect to the total mass of the magnetic particle-containing layer was calculated as the content of the magnetic particles with respect to the total amount of solid contents of the coating liquid. Here, the solid contents refer to components excluding the solvent and are magnetic particles and a polystyrene butadiene block copolymer in the above-described coating liquid.

The content of the magnetic particles with respect to the total mass of the magnetic particle-containing layer can also be determined from the total mass of the magnetic particle-containing layer and the mass of the magnetic particles taken out from the magnetic particle-containing layer by a known method.

<Evaluation of Break Resistance>

A sample piece of the magnetic particle-containing layer was bent at right angles, and the bent portion was observed with an optical microscope (LV150 manufactured by Nikon Corporation) at a magnification of 500 times to check the presence or absence of breakage.

<Evaluation of Electromagnetic Wave Shielding Ability (KEC Method)>

A shielding material cut to a size of 150 mm×150 mm was installed between antennas of a KEC method evaluation device including a signal generator, an amplifier, a pair of magnetic field or electric field antennas, and a spectrum analyzer, and at a frequency of 100 kHz to 1 GHz, a ratio of the intensity of the received signal in a case where the shielding material was not present to the intensity of the received signal in a case where the shielding material was present was determined and denoted as the shielding ability. This procedure was carried out for each of the magnetic field antenna and the electric field antenna, and the magnetic field wave shielding ability and the electric field wave shielding ability were determined.

<Measurement of Curve Width>

The shielding material was cut into a size of 4 cm×2 cm. The cut-out sample piece was firmly bent in half by hand and then spread out and flattened. The spread small piece was attached to a slide glass, and the bent portion was observed with an optical microscope (LV150 manufactured by Nikon Corporation) at a magnification of 50 times, and an image was acquired. In the acquired image, a portion which was bright or dark as compared with a place which had not been bent was denoted as the deformed portion, and the width thereof was measured. The width measured in this way was denoted as the curve width.

Example 2

An electromagnetic wave shielding material was prepared, and various measurements and evaluations shown in Table 1 and Table 2 were carried out by the same methods as in Example 1, except that at the time of preparing the coating liquid, the polystyrene polybutadiene block copolymer was changed to 38 g of a polyurethane resin of a concentration of solid contents of 30% by mass (UR-8300, manufactured by TOYOBO Co., Ltd.) and 0.5 g of a polyfunctional isocyanate (CORONATE L manufactured by Tosoh Corporation).

Example 3

An electromagnetic wave shielding material was prepared, and various measurements and evaluations shown in Table 1 and Table 2 were carried out by the same methods as in Example 1, except that the amount of cyclohexanone in the coating liquid was 300 g and the coating gap was 500 μm.

Example 4

An electromagnetic wave shielding material was prepared, and various measurements and evaluations shown in Table 1 and Table 2 were carried out by the same methods as in Example 1, except that the amount of cyclohexanone in the coating liquid was 400 g and the coating gap was 600 μm.

Example 5

An electromagnetic wave shielding material was prepared, and various measurements and evaluations shown in Table 1 and Table 2 were carried out by the same methods as in Example 1, except that the coating liquid was prepared according to the following method.

To a plastic bottle, the following substances were added and mixed with a shaker-type stirrer for 1 hour to prepare a coating liquid;

iron-based nanocrystal alloy magnetic particles (KUA-METNC1 053C03A, manufactured by Epson Atmix Corporation): 75 g, iron-based amorphous magnetic particles (AW2-08 PF-3F manufactured by Epson Atmix Corporation): 25 g, a polystyrene polybutadiene block copolymer (manufactured by Sigma-Aldrich Japan): 3.2 g, and cyclohexanone: 205 g.

Example 6

An electromagnetic wave shielding material was prepared, and various measurements and evaluations shown in Table 1 and Table 2 were carried out by the same methods as in Example 1, except that at the time of preparing the coating liquid, the polystyrene polybutadiene block copolymer was changed to 12 g of polybenzyl methacrylate (manufactured by Sigma-Aldrich Japan).

Example 7

An electromagnetic wave shielding material was prepared, and various measurements and evaluations shown in Table 1 and Table 2 were carried out by the same methods as in Example 1, except that at the time of preparing the coating liquid, the polystyrene polybutadiene block copolymer was changed to 12 g of polymethyl methacrylate (manufactured by Sigma-Aldrich Japan).

Example 8

A magnetic particle-containing layer was prepared by the same method as in Example 1.

Using the same copper foil as the copper foil used as the metal layer in Example 1, five layers of "copper foil/magnetic particle-containing layer/copper foil/magnetic particle-containing layer/copper foil" were bonded by disposing the same double-sided tape as the double-sided tape used in Example 1 between the respective layers. The electromagnetic wave shielding material of Example 8 prepared in this way was subjected to the measurements and the evaluations shown in Table 1 and Table 2 by the same methods as in Example 1.

Example 9

An electromagnetic wave shielding material was prepared, and various measurements and evaluations shown in Table 1 and Table 2 were carried out by the same methods as in Example 8, except that the magnetic particle-containing layer after the pressurization treatment was peeled off from the release film, three sheets thereof were laminated, and the pressurization treatment was carried out again by the same method to increase the thickness of the magnetic particle-containing layer.

Example 10

An electromagnetic wave shielding material was prepared, and various measurements and evaluations shown in Table 1 and Table 2 were carried out by the same methods as in Example 1, except that the thickness of one of the two copper foils was changed to 20 μm.

Example 11

An electromagnetic wave shielding material was prepared, and various measurements and evaluations shown in Table 1 and Table 2 were carried out by the same methods as in Example 1, except that the thickness of one of the two copper foils was changed to 18 μm and the thickness of the other was changed to 2 μm.

Example 12

An electromagnetic wave shielding material was prepared, and various measurements and evaluations shown in Table 1 and Table 2 were carried out by the same methods as in Example 1, except that each of the two copper foils was changed to an aluminum foil having a thickness of 15 μm (conforming to the JIS H4160: 2006 standard, alloy number: 1N30(1) with temper designation of O, Al content: 99.3% by mass or more).

As a result of measuring the mass of the shielding material of Example 12, having a size of 15 cm×15 cm, the mass was 4.5 g. On the other hand, as a result of measuring the mass of the shielding material of Example 1, having the same size, the mass was 6.7 g.

Example 13

<Formation of Adhesive Layer>
(Preparation of Coating Liquid)

To a plastic bottle, the following substances were added and mixed with a shaker-type stirrer for 1 hour to prepare a coating liquid;

a polyurethane resin having a concentration of solid contents of 30% by mass (UR-8300, manufactured by TOYOBO Co., Ltd.): 100 g, and methyl ethyl ketone: 900 g.

(Formation of Film of Adhesive Layer)

A coating liquid was applied onto a peeling surface of a peeling-treated PET film (PET75TR manufactured by NIPPA Co., Ltd.) with a blade coater having a coating gap of 300 μm and dried for 30 minutes in a drying device having an internal atmospheric temperature of 80° C. to form, on the release film, a film of the adhesive layer corresponding to the above-described adhesive layer into a film shape.

Two release film-attached adhesive layers were produced according to the above method.

<Formation of Adhesive Layer-Attached and Magnetic Particle-Containing Layer (High Magnetic Permeability Layer)>

Upper and lower press plates of a plate-shape pressing machine (a large-scale hot press TA-200-1 W manufactured by YAMAMOTO ENG. WORKS Co., LTD.) were heated to 140° C. (the internal temperature of the press plate), the release film-attached adhesive layer was installed in the center of the press plate with the adhesive layer facing the upper surface side, the magnetic particle-containing layer produced by the method described in Example 2 was installed on the adhesive layer, and the release film-attached adhesive layer was further installed thereon with the adhesive layer facing the lower surface side so that the adhesive layer faced the magnetic particle-containing layer side, followed by being held for 10 minutes in a state where a pressure of 4.66 N/mm² was applied. The upper and lower press plates were cooled to 50° C. (the internal temperature of the press plates) while maintaining the pressure, and then the double-side adhesive layer-attached magnetic particle-containing layer was taken out together with the release film.

<Formation of Shielding Material>

Upper and lower press plates of a plate-shape pressing machine (a large-scale hot press TA-200-1 W manufactured by YAMAMOTO ENG. WORKS Co., LTD.) were heated to 140° C. (the internal temperature of the press plate), and a copper foil having a thickness of 10 μm (conforming to the JIS H3100: 2018 standard, alloy number: C1100R, copper content: 99.90% by mass or more), a double-sided adhesive layer-attached magnetic particle-containing layer from which the release films on both sides had been peeled off, and a copper foil having a thickness of 10 μm were installed in this order in the center of the press plate, followed by being held for 10 minutes in a state where a pressure of 4.66 N/mm² was applied. The upper and lower press plates were cooled to 50° C. (the internal temperature of the press plates) while maintaining the pressure, and then the shielding material was taken out together with the release film.

Then, the release film was peeled off to obtain an electromagnetic wave shielding material of Example 13. The shielding material of Example 13 includes a multilayer structure of "copper foil/magnetic particle-containing layer (high magnetic permeability layer)/copper foil". The electromagnetic wave shielding material of Example 13 was subjected to various measurements and evaluations shown in Table 1 and Table 2.

Example 14

<Formation of Adhesive Layer>
(Preparation of Coating Liquid)

To a plastic bottle, the following substances were added and mixed with a shaker-type stirrer for 1 hour to prepare a coating liquid;

a polyurethane resin having a concentration of solid contents of 30% by mass (UR-8300, manufactured by TOYOBO Co., Ltd.): 100 g, and methyl ethyl ketone: 900 g.

(Formation of Film of Adhesive Layer)

A coating liquid was applied onto a copper foil having a thickness of 10 μm (conforming to the JIS H3100: 2018 standard, alloy number: C1100R, copper content: 99.90% by mass or more) with a blade coater having a coating gap of 100 μm and dried for 30 minutes in a drying device having an internal atmospheric temperature of 80° C. to form, on the metal layer, a film of the adhesive layer corresponding to the above-described adhesive layer into a film shape.

Two adhesive layer-attached metal layers were produced according to the above method.

<Formation of Shielding Material>

Upper and lower press plates of a plate-shape pressing machine (a large-scale hot press TA-200-1 W manufactured by YAMAMOTO ENG. WORKS Co., LTD.) were heated to 140° C. (the internal temperature of the press plate), the adhesive layer-attached metal layer was installed in the center of the press plate with the adhesive layer facing the upper surface side, the magnetic particle-containing layer produced by the method described in Example 2 was installed on the adhesive layer, and the adhesive layer-attached metal layer was further installed thereon with the adhesive layer facing the lower surface side so that the adhesive layer faced the magnetic particle-containing layer side, followed by being held for 10 minutes in a state where a pressure of 4.66 N/mm² was applied. The upper and lower press plates were cooled to 50° C. (the internal temperature of the press plates) while maintaining the pressure, and then the shielding material was taken out.

Then, the release film was peeled off to obtain an electromagnetic wave shielding material of Example 14. The shielding material of Example 14 includes a multilayer structure of "copper foil/magnetic particle-containing layer (high magnetic permeability layer)/copper foil". The electromagnetic wave shielding material of Example 14 was subjected to various measurements shown in Table 1 and Table 2.

Example 15

An electromagnetic wave shielding material was prepared, and various measurements and evaluations shown in Table 1 and Table 2 were carried out by the same methods as in Example 1, except that the amount of the polystyrene polybutadiene block copolymer in the coating liquid was 38 g and the amount of cyclohexanone was 250 g.

Example 16

An electromagnetic wave shielding material was prepared, and various measurements and evaluations shown in Table 1 and Table 2 were carried out by the same methods as in Example 1, except that the amount of the polystyrene polybutadiene block copolymer in the coating liquid was 45 g and the amount of cyclohexanone was 260 g.

Comparative Example 1

An electromagnetic wave shielding material was prepared, and various measurements and evaluations shown in Table 1 and Table 2 were carried out by the same methods as in Example 1, except that the coating liquid was prepared according to the following method.

To a plastic bottle, the following substances were added and mixed with a shaker-type stirrer for 1 hour to prepare a coating liquid;

iron-based amorphous magnetic particles (AW2-08 PF-15F manufactured by Epson Atmix Corporation): 100 g, a polystyrene polybutadiene block copolymer (manufactured by Sigma-Aldrich Japan): 3.2 g, and cyclohexanone: 205 g.

Comparative Example 2

An electromagnetic wave shielding material was prepared, and various measurements and evaluations shown in Table 1 and Table 2 were carried out by the same methods as in Example 1, except that the amount of cyclohexanone in the coating liquid was 500 g and the coating gap was 800 μm.

Comparative Example 3

An electromagnetic wave shielding material was prepared, and various measurements and evaluations shown in Table 1 and Table 2 were carried out by the same methods as in Example 1, except that the metal layer (the copper foil) was disposed on only one side of the magnetic particle-containing layer.

Comparative Example 4

An electromagnetic wave shielding material was prepared, and various measurements and evaluations shown in Table 1 and Table 2 were carried out by the same methods as in Example 1, except that the coating liquid was prepared according to the following method. The layer formed by using the following coating liquid is a resin layer that does not contain magnetic particles.

To a plastic bottle, the following substances were added and mixed with a shaker-type stirrer for 1 hour to prepare a coating liquid;

a polystyrene polybutadiene block copolymer (manufactured by Sigma-Aldrich Japan): 20 g, and cyclohexanone: 205 g.

Comparative Example 5

Using a copper foil (thickness: 10 μm) alone as an electromagnetic wave shielding material of Comparative Example 5, various measurements and evaluations shown in Tables 1 and 2 were performed by the same method as in Example 1.

Comparative Example 6

Using a copper foil (thickness: 20 μm) alone as an electromagnetic wave shielding material of Comparative Example 6, various measurements and evaluations shown in Tables 1 and 2 were performed by the same method as in Example 1.

Comparative Example 7

A magnetic particle-containing layer was prepared by the same method as in Example 1.

Using the same copper foil as the copper foil used as the metal layer in Example 1, three layers of "magnetic particle-containing layer/copper foil/magnetic particle-containing layer" were bonded by disposing the same double-sided tape as the double-sided tape used in Example 1 between the respective layers. The electromagnetic wave shielding material of Comparative Example 7 prepared in this way was subjected to the measurements and the evaluations shown in Table 1 and Table 2 by the same methods as in Example 1.

Reference Example 1

Using a copper plate (thickness: 115 μm) alone as an electromagnetic wave shielding material of Reference Example 1, various measurements and evaluations shown in Tables 1 and 2 were performed by the same method as in Example 1.

<Measurement of Glass Transition Temperature Tg of Resin>

The same resin (a pellet-shaped or powder-shaped sample) as the resin used in the preparation of the coating liquid was placed in a sample pan made of aluminum and sealed with a pressing machine, and the heat flow was measured under the following conditions using Q100 manufactured by TA Instruments as a differential scanning calorimeter. From the measurement results, the glass transition temperature of the resin was determined as the baseline shift start temperature in the heat flowchart at the time of temperature rise.

(Measurement Conditions)

Scanning temperature: −80.0° C. to 200.0° C.

Temperature rising rate: 10.0° C./min

The above results are shown in Table 1 (Table 1-1 to Table 1-2) and Table 2 (Table 2-1 and Table 2-2). In Table 1, the column in which the electric field wave shielding ability and the magnetic field wave shielding ability are indicated as numerical values with "or more" indicates that it is equal to or higher than the upper limit of evaluation of the KEC method evaluation device used. Regarding the magnetic field wave shielding ability, it is desirable that the magnetic field wave shielding ability at 100 kHz is 10.0 dB or more and that the magnetic field wave shielding ability at 10 MHz is 70.0 dB or more.

TABLE 1

| | Layer configuration (respective layers) are adhered with double-sided tape having a thickness of 5 μm | Magnetic field wave shielding ability [dB] | | | Electric field wave shielding ability [dB] | | | Magnetic particle content of magnetic particle-containing layer [% by mass] | Magnetic permeability of magnetic particle-containing layer | Electrical conductivity of magnetic particle-containing layer [S/m] | Containing or not containing of flat-shaped particles in magnetic particle-containing layer | Aspect ratio of flat-shaped particle | Alignment degree of flat-shaped particle [°] | Thickness ratio between metal layers [T2/T1] |
|---|---|---|---|---|---|---|---|---|---|---|---|---|---|---|
| | | 100 kHz | 10 MHz | 1 GHz | 100 kHz | 10 MHz | 1 GHz | | | | | | | |
| Example 1 | 10 μm of copper foil/30 μm of magnetic particle-containing layer/10 μm of copper foil | 14.2 | 79.4 | 97 or more | 55 or more | 96 or more | 97 or more | 89 | 148 | $1.1 \times 10^{-2}$ | Containing flat-shaped particles | 0.071 | 13 | 1.00 |
| Example 2 | 10 μm of copper foil/30 μm of magnetic particle-containing layer/10 μm of copper foil | 14.0 | 78.2 | 97 or more | 55 or more | 96 or more | 97 or more | 89 | 144 | $1.6 \times 10^{-5}$ | Containing flat-shaped particles | 0.072 | 12 | 1.00 |
| Example 3 | 10 μm of copper foil/30 μm of magnetic particle-containing layer/10 μm of copper foil | 11.7 | 71.5 | 97 or more | 55 or more | 96 or more | 97 or more | 89 | 60 | $1.1 \times 10^{-2}$ | Containing flat-shaped particles | 0.070 | 25 | 1.00 |
| Example 4 | 10 μm of copper foil/30 μm of magnetic particle-containing layer/10 μm of copper foil | 10.8 | 71.0 | 97 or more | 55 or more | 96 or more | 97 or more | 89 | 51 | $1.1 \times 10^{-2}$ | Containing flat-shaped particles | 0.072 | 27 | 1.00 |
| Example 5 | 10 μm of copper foil/30 μm of magnetic particle-containing layer/10 μm of copper foil | 10.0 | 70.2 | 97 or more | 55 or more | 96 or more | 97 or more | 97 | 30 | $1.1 \times 10^{-5}$ | Not containing | — | — | 1.00 |
| Example 6 | 10 μm of copper foil/30 μm of magnetic particle-containing layer/10 μm of copper foil | 14.1 | 78.2 | 97 or more | 55 or more | 96 or more | 97 or more | 89 | 148 | $5.3 \times 10^{-5}$ | Containing flat-shaped particles | 0.072 | 13 | 1.00 |
| Example 7 | 10 μm of copper foil/30 μm of magnetic particle-containing layer/10 μm of copper foil | 14.0 | 79.3 | 97 or more | 55 or more | 96 or more | 97 or more | 89 | 148 | $2.9 \times 10^{-5}$ | Containing flat-shaped particles | 0.073 | 13 | 1.00 |
| Example 8 | 10 μm of copper foil/30 μm of magnetic particle-containing layer/10 μm of copper foil/30 μm of magnetic particle-containing layer/10 μm of copper foil | 24.1 | 88 or more | 97 or more | 55 or more | 96 or more | 97 or more | 89 | 148 | $1.1 \times 10^{-5}$ | Containing flat-shaped particles | 0.072 | 13 | 1.00 |
| Example 9 | 10 μm of copper foil/30 μm of magnetic particle-containing layer/10 μm of copper foil/80 μm of magnetic particle-containing layer/10 μm of copper foil | 38.7 | 88 or more | 97 or more | 55 or more | 96 or more | 97 or more | 89 | 148 | $1.1 \times 10^{-2}$ | Containing flat-shaped particles | 0.070 | 13 | 1.00 |
| Example 10 | 20 μm of copper foil/30 μm of magnetic particle-containing layer/10 μm of copper foil | 17.9 | 85.6 | 97 or more | 55 or more | 96 or more | 97 or more | 89 | 147 | $1.1 \times 10^{-2}$ | Containing flat-shaped particles | 0.070 | 12 | 0.50 |
| Example 11 | 18 μm of copper foil/30 μm of magnetic particle-containing layer/2 μm of copper foil | 12.9 | 78.1 | 97 or more | 55 or more | 96 or more | 97 or more | 89 | 148 | $1.1 \times 10^{-2}$ | Containing flat-shaped particles | 0.071 | 13 | 0.11 |
| Example 12 | 10 μm of aluminum foil/30 μm of magnetic particle-containing layer/10 μm of aluminum foil | 14.1 | 79.1 | 97 or more | 55 or more | 96 or more | 97 or more | 89 | 148 | $1.1 \times 10^{-2}$ | Containing flat-shaped particles | 0.071 | 13 | 1.00 |
| Example 15 | 10 μm of copper foil/30 μm of magnetic particle-containing layer/10 μm of copper foil | 12.8 | 75.2 | 97 or more | 55 or more | 96 or more | 97 or more | 72 | 95 | $1.1 \times 10^{-2}$ | Containing flat-shaped particles | 0.070 | 19 | 1.00 |
| Example 16 | 10 μm of copper foil/30 μm of magnetic particle-containing layer/10 μm of copper foil | 12.4 | 73.4 | 97 or more | 55 or more | 96 or more | 97 or more | 69 | 78 | $1.1 \times 10^{-2}$ | Containing flat-shaped particles | 0.072 | 22 | 1.00 |
| Comparative Example 1 | 10 μm of copper foil/30 μm of magnetic particle-containing layer/10 μm of copper foil | 9.3 | 85.6 | 97 or more | 55 or more | 96 or more | 97 or more | 97 | 25 | $1.1 \times 10^{-2}$ | Not containing | — | — | 1.00 |

TABLE 1-continued

| | Layer configuration (respective layers) are adhered with double-sided tape having a thickness of 5 μm | Magnetic field wave shielding ability [dB] 100 kHz | 10 MHz | 1 GHz | Electric field wave shielding ability [dB] 100 kHz | 10 MHz | 1 GHz | Magnetic particle content of magnetic particle-containing layer [% by mass] | Magnetic permeability of magnetic particle-containing layer | Electrical conductivity of magnetic particle-containing layer [S/m] | Containing or not containing of flat-shaped particles in magnetic particle-containing layer | Aspect ratio of flat-shaped particle | Alignment degree of flat-shaped particle [°] | Thickness ratio between metal layers [T2/T1] |
|---|---|---|---|---|---|---|---|---|---|---|---|---|---|---|
| Comparative Example 2 | 10 μm of copper foil/30 μm of magnetic particle-containing layer/10 μm of copper foil | 9.5 | 86.1 | 97 or more | 55 or more | 96 or more | 97 or more | 89 | 27 | $1.1 \times 10^{-2}$ | Containing flat-shaped particles | 0.073 | 33 | 1.00 |
| Comparative Example 3 | 30 μm of magnetic particle-containing layer/10 μm of copper foil | 8.5 | 44.6 | 97 or more | 55 or more | 96 or more | 97 or more | 89 | 146 | $1.1 \times 10^{-2}$ | Containing flat-shaped particles | 0.071 | 14 | — |
| Comparative Example 4 | 30 μm of copper foil/10 μm of resin layer/10 μm of copper foil | 9.3 | 46.0 | 97 or more | 55 or more | 96 or more | 97 or more | — | 1 | — | — | — | — | 1.00 |
| Comparative Example 5 | 10 μm of copper foil | 6.2 | 40.6 | 88.3 | 55 or more | 96 or more | 97 or more | — | — | — | — | — | — | — |
| Comparative Example 6 | 20 μm of copper foil | 10.6 | 47.2 | 97 or more | 55 or more | 96 or more | 97 or more | — | — | — | — | — | — | — |
| Comparative Example 7 | 30 μm of resin layer/10 μm of copper foil/30 μm of resin layer | 9.8 | 16.5 | 97 or more | 55 or more | 96 or more | 97 or more | 89 | 148 | $1.1 \times 10-$ | Containing flat-shaped particles | 0.071 | 13 | — |
| Reference Example 1 | 115 μm of copper foil | 24.0 | 83.0 | 97 or more | 55 or more | 96 or more | 97 or more | — | — | — | — | — | — | — |
| Example 13 | 10 μm of copper foil/30 μm of magnetic particle-containing layer/10 μm of copper foil | 14.1 | 78.0 | 97 or more | 55 or more | 96 or more | 97 or more | | | | | | | |
| Example 14 | 10 μm of copper foil/30 μm of magnetic particle-containing layer/10 μm of copper foil | 14.2 | 78.2 | 97 or more | 55 or more | 96 or more | 97 or more | | | | | | | |

From the results shown in Table 1, it can be confirmed that the electromagnetic wave shielding materials of Examples 1 to 16 which include a multilayer structure having, between two metal layers, a high magnetic permeability layer that is an insulating layer in which a real part of a complex specific magnetic permeability at a frequency of 100 kHz is 30 or more have both an excellent in electric field wave shielding ability and an excellent magnetic field wave shielding ability in a wide frequency range from low frequency to high frequency. On the other hand, in the electromagnetic wave shielding materials of Comparative Examples 1 to 7, the shielding ability against a magnetic field wave of 100 kHz and/or 10 MHz in a low frequency range is low as compared with the electromagnetic wave shielding materials of Examples 1 to 16. It is noted that Reference Example 1 is a reference example that shows that the metal layer has to be made significantly thick as compared with the metal layer included in the electromagnetic wave shielding material of Examples, in order to obtain a high electric field wave shielding ability and a high magnetic field wave shielding ability in a wide frequency range from low frequency to high frequency with the metal layer alone. However, as shown in Table 2, it has been confirmed that in such a thick metal layer, the curve width is widened.

TABLE 2

| | Layer configuration (respective layers are adhered with adhesive layer having a thickness of 5 μm) | Overall thickness of shielding material [μm] | Total thickness of metal layers [μm] | Resin Tg [° C.] | Curve width [mm] | Break resistance |
|---|---|---|---|---|---|---|
| Example 1 | 10 μm of copper foil/30 μm of magnetic particle-containing layer/10 um of copper foil | 60 | 20 | −70 | 0.42 | No break |
| Example 2 | 10 μm of copper foil/30 μm of magnetic particle-containing layer/10 um of copper foil | 60 | 20 | 23 | 0.44 | No break |
| Example 3 | 10 μm of copper foil/30 μm of magnetic particle-containing layer/10 um of copper foil | 60 | 20 | −70 | 0.39 | No break |
| Example 4 | 10 μm of copper foil/30 μm of magnetic particle-containing layer/10 um of copper foil | 60 | 20 | −70 | 0.38 | No break |
| Example 5 | 10 μm of copper foil/30 μm of magnetic particle-containing layer/10 um of copper foil | 60 | 20 | −70 | 0.44 | No break |
| Example 6 | 10 μm of copper foil/30 μm of magnetic particle-containing layer/10 um of copper foil | 60 | 20 | 54 | 0.46 | Break |
| Example 7 | 10 μm of copper foil/30 μm of magnetic particle-containing layer/10 um of copper foil | 60 | 20 | 109 | 0.55 | Break |
| Example 8 | 10 μm of copper foil/30 μm of magnetic particle-containing layer/10 um of copper foil/30 μm of magnetic particle-containing layer/10 μm of copper foil | 110 | 30 | −70 | 0.95 | No break |
| Example 9 | 10 μm of copper foil/80 μm of magnetic particle-containing layer/10 um of copper foil/80 μm of magnetic particle-containing layer/10 μm of copper foil | 210 | 30 | −70 | 2.11 | No break |
| Example 10 | 20 μm of copper foil/30 μm of magnetic particle-containing layer/10 um of copper foil | 70 | 30 | −70 | 0.63 | No break |
| Example 11 | 18 μm of copper foil/30 μm of magnetic particle-containing layer/2 μm of copper foil | 60 | 20 | −70 | 0.45 | No break |
| Example 12 | 15 μm of aluminum foil/30 μm of magnetic particle-containing layer/10 μm of aluminum foil | 70 | 30 | −70 | 0.56 | No break |
| Example 15 | 10 μm of copper foil/30 μm of magnetic particle-containing layer/10 um of copper foil | 60 | 20 | −70 | 0.43 | No break |
| Example 16 | 10 μm of copper foil/30 μm of magnetic particle-containing layer/10 um of copper foil | 60 | 20 | −70 | 0.44 | No break |
| Comparative Example 1 | 10 μm of copper foil/30 μm of magnetic particle-containing layer/10 um of copper foil | 60 | 20 | −70 | 0.52 | No break |
| Comparative Example 2 | 10 μm of copper foil/30 μm of magnetic particle-containing layer/10 um of copper foil | 60 | 20 | −70 | 0.51 | No break |
| Comparative Example 3 | 30 μm of magnetic particle-containing layer/10 μm of copper foil | 45 | 10 | −70 | 0.35 | No break |
| Comparative Example 4 | 10 μm of copper foil/30 μm of resin layer/10 μm of copper foil | 60 | 20 | — | 0.41 | — |
| Comparative Example 5 | 10 μm of copper foil | 10 | 10 | — | 0.21 | — |
| Comparative Example 6 | 20 μm of copper foil | 20 | 20 | — | 0.49 | — |
| Comparative Example 7 | 30 μm of resin layer/10 μm of copper foil/30 μm of resin layer | 80 | 10 | −70 | 0.52 | No break |
| Reference Example 1 | 115 μm of copper foil | 115 | 115 | — | 2.26 | — |
| Example 13 | 10 μm of copper foil/30 μm of magnetic particle-containing layer/10 μm of copper foil | 52 | 20 | 23 | 0.41 | No break |
| Example 14 | 10 μm of copper foil/30 μm of magnetic particle-containing layer/10 μm of copper foil | 52 | 20 | 23 | 0.40 | No break |

One aspect of the present invention is useful in the technical fields of various electronic components and various electronic apparatuses.

What is claimed is:

1. An electromagnetic wave shielding material comprising:

a multilayer structure having, between two metal layers, a high magnetic permeability layer that is an insulating layer in which a real part of a complex specific magnetic permeability at a frequency of 100 kHz is 30 or more.

2. The electromagnetic wave shielding material according to claim 1, wherein the high magnetic permeability layer contains magnetic particles.

3. The electromagnetic wave shielding material according to claim 2, wherein the magnetic particles include metal particles.

4. The electromagnetic wave shielding material according to claim 2, wherein the high magnetic permeability layer contains flat-shaped particles as the magnetic particles.

5. The electromagnetic wave shielding material according to claim 4, wherein an alignment degree is 30° or lower, where the alignment degree is a sum of an absolute value of an average value of alignment angles of the flat-shaped particles with respect to a surface of the high magnetic permeability layer and a variance of the alignment angles.

6. The electromagnetic wave shielding material according to claim 3, wherein the high magnetic permeability layer contains flat-shaped particles as the magnetic particles.

7. The electromagnetic wave shielding material according to claim 6, wherein an alignment degree is 30° or lower, where the alignment degree is a sum of an absolute value of an average value of alignment angles of the flat-shaped particles with respect to a surface of the high magnetic permeability layer and a variance of the alignment angles.

8. The electromagnetic wave shielding material according to claim 1, wherein the high magnetic permeability layer contains a resin.

9. The electromagnetic wave shielding material according to claim 8, wherein a glass transition temperature Tg of the resin is 50° C. or lower.

10. The electromagnetic wave shielding material according to claim 7, wherein the high magnetic permeability layer contains a resin, and a glass transition temperature Tg of the resin is 50° C. or lower.

11. The electromagnetic wave shielding material according to claim 1, wherein in a case where a thickness of one metal layer of the two metal layers is denoted as T1 and a thickness of the other metal layer is denoted as T2, T1 is equal to or larger than T2, and a thickness ratio, T2/T1, is 0.15 or more.

12. The electromagnetic wave shielding material according to claim 10, wherein in a case where a thickness of one metal layer of the two metal layers is denoted as T1 and a thickness of the other metal layer is denoted as T2, T1 is equal to or larger than T2, and a thickness ratio, T2/T1, is 0.15 or more.

13. The electromagnetic wave shielding material according to claim 1, wherein one or both of the two metal layers is a metal layer in which a content of a metal selected from the group consisting of Al and Mg is 80.0% by mass or more.

14. The electromagnetic wave shielding material according to claim 1, further comprising one or more layers selected from the group consisting of a pressure-sensitive adhesive layer and an adhesive layer.

15. The electromagnetic wave shielding material according to claim 1, wherein a total thickness of the metal layers included in the electromagnetic wave shielding material is 100 μm or less.

16. The electromagnetic wave shielding material according to claim 1, wherein an overall thickness of the electromagnetic wave shielding material is 200 μm or less.

17. An electronic component comprising:

the electromagnetic wave shielding material according to claim 1.

18. An electronic apparatus comprising:

the electromagnetic wave shielding material according to claim 1.

* * * * *